United States Patent [19]

Abe

[11] Patent Number: 5,301,140

[45] Date of Patent: Apr. 5, 1994

[54] MICROCOMPUTER THAT DETECTS WHETHER THE OUTPUT OF AN ANALOG TO DIGITAL CONVERTOR IS INCREASING OR DECREASING OVERTIME

[75] Inventor: Nobuskue Abe, Hyogo, Japan

[73] Assignee: Mitsubishi Denki Kabushiki Kaisha, Tokyo, Japan

[21] Appl. No.: 997,984

[22] Filed: Dec. 28, 1992

[30] Foreign Application Priority Data

Jan. 28, 1992 [JP] Japan .................................. 4-37267

[51] Int. Cl.⁵ .............................................. G06F 7/50
[52] U.S. Cl. ............................................. 364/769
[58] Field of Search ................ 364/769; 340/146.2; 358/105

[56] References Cited

U.S. PATENT DOCUMENTS 4,799,190  1/1989  Douglas et al. ............... 364/769 X

OTHER PUBLICATIONS

Chambers et al, "Digital Peak Detecting and Ripple Testing Device", IBM Tech. Discl. Bull., vol. 17, No. 7, pp. 1869–1870, Dec. 1974.

Primary Examiner—Tan V. Mai
Attorney, Agent, or Firm—Townsend and Townsend Khourie and Crew

[57] ABSTRACT

The result of an analog to digital conversion is stored in a first storage unit, the contents of the first storage unit are transferred to a second storage unit, and the contents of these storage units are compared by an arithmetic unit to determine whether the result of the analog to digital conversion increases or decreases over time.

3 Claims, 8 Drawing Sheets

| x | y | CIN | S | COUT |
|---|---|-----|---|------|
| L | L | L | L | L |
| L | L | H | H | L |
| L | H | L | H | L |
| L | H | H | L | H |
| H | L | L | H | L |
| H | L | H | L | H |
| H | H | L | L | H |
| H | H | H | H | H |

| a | b | c | d | out |
|---|---|---|---|-----|
| L | L | L | L | L |
| L | L | L | H | L |
| L | L | H | L | L |
| L | L | H | H | H |
| L | H | L | L | L |
| L | H | L | H | L |
| L | H | H | L | L |
| L | H | H | H | H |
| H | L | L | L | L |
| H | L | L | H | L |
| H | L | H | L | L |
| H | L | H | H | H |
| H | H | L | L | L |
| H | H | L | H | H |
| H | H | H | L | H |
| H | H | H | H | H |

| T1 | T2 | x | T3 | T4 |
|---|---|---|---|---|
| L | L | L | \} HOLDING OF THE | |
| L | L | H | \} PREVIOUS VALUE | |
| L | H | L | L | L |
| L | H | H | L | L |
| H | L | L | L | H |
| H | L | H | H | L |
| H | H | L | \} THIS STATE DOES NOT | |
| H | H | H | \} EXIST.(REFER TO FIG.6 AS FOR T1 AND T2.) | |

F.F 8F ARE SET BY A VALUE OF x WHEN T1 IS AT H.   RESET F.F 8F WHEN T2 IS AT H.

| T | D | Q | $\overline{Q}$ |
|---|---|---|---|
| L | L | NO CHANGE | NO CHANGE |
| L | H | NO CHANGE | NO CHANGE |
| H | L | L | H |
| H | H | H | L |

MICROCOMPUTER THAT DETECTS WHETHER THE OUTPUT OF AN ANALOG TO DIGITAL CONVERTOR IS INCREASING OR DECREASING OVERTIME

BACKGROUND OF THE INVENTION

1. Field of the Invention

The present invention relates to a microcomputer comprising an A/D converter and capable of detecting whether the result of conversion by the A/D converter increases or decreases.

2. Description of the Prior Art

Figure 7:
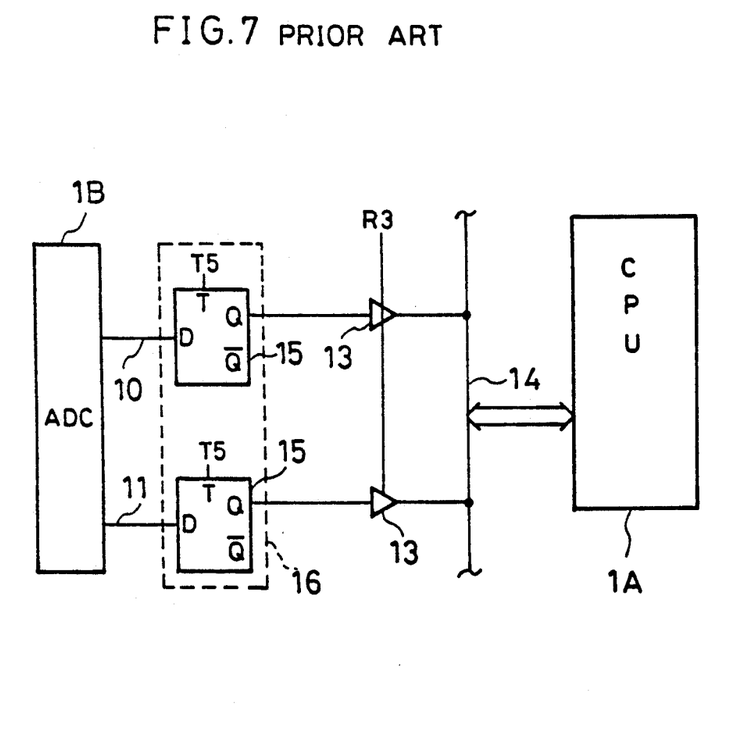
FIG. 7 is a diagram of the configuration of a microcomputer having a built-in A/D converter of the prior art.
Figure 8A:
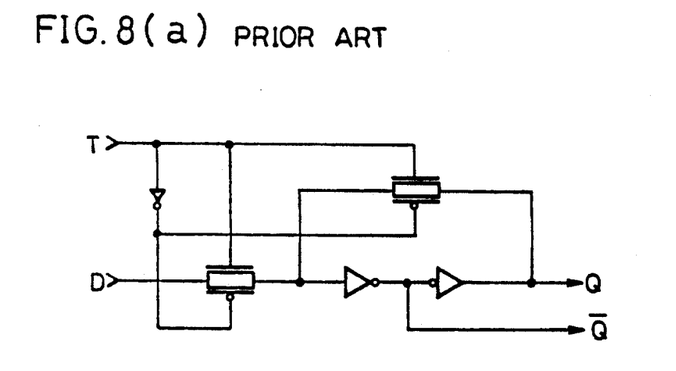
FIG. 8(a) is a diagram of the configuration of a latch and FIG. 8(b) is a truth table thereof.
Figure 8B:
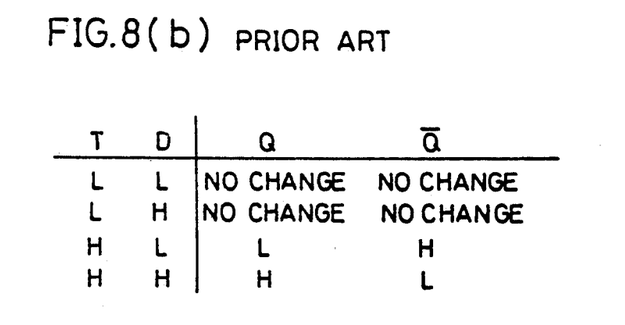

FIG. 7 is a schematic diagram of the configuration of a microcomputer comprising a conventional A/D converter. For simplification, a 2-bit A/D converter is shown here. In the figure, reference symbol 1A represents a CPU, 1B an A/D converter, 10 a low-order bit data line of the conversion result of the A/D converter 1B, 11 a high-order bit data line of the conversion result of the A/D converter, 13 a tri-state buffer, 14 a system bus and 15 a latch. As shown in FIG. 8, when T is at "H", data inputted from D is inputted into the latch 15 which keeps the data latched while T remains at "L" and outputs the inverted data of the data latched by Q to Q. Reference numeral 16 represents A/D conversion result storage means which consists of two units of the latch 15 for storing the above-mentioned low-order and high-order bit data, that is the conversion result of the A/D converter 1B, R3 a read signal which becomes active when it reads the contents of this A/D conversion result storage means for output to the system bus 14, and T5 a signal indicative of the completion of A/D conversion by the A/D converter 1B which is also active at "H".

The operation of the microcomputer will be explained hereafter. When the A/D conversion operation of the A/D converter 1B is completed, the A/D conversion complete signal T5 becomes active ("H"), and the result of A/D conversion is stored in the storage means 16 for storing the result of A/D conversion. The contents of the result can be read and outputted to the system bus 14 through the tri-state buffer 13 by the R3 signal.

Since the microcomputer comprising the conventional A/D converter is structured as described above, the microcomputer does not have means for detecting whether the result of A/D conversion increases or decreases with the passage of time. However, for its application, correction control (for instance, compensation for the influence of a superimposed direct current when the amount of an alternating current is sampled for digital conversion) is performed according to an increase or decrease in analog voltage. Furthermore, according to whether an absolute value of a change is abnormal or not, the step goes to an exception process (in the above case, supposing that the amount of the alternating current is a sine wave, data on the next input amount predicted from the current input amount and the previous input amount is compared with the actual next input amount. When there is a difference between them, it is determined that the amount of the alternating current is abnormal, and the step enters a program processing routine). These processes are controlled by software. If this processing of this important data obtained from the A/D converter is performed by a conventional A/D converter, a large overhead (longer processing time and a greater load on the CPU 1A) occurs on the processing of data such as data saving and arithmetic operation, thus making difficult high-speed and advanced control.

SUMMARY OF THE INVENTION

The present invention has been worked out to solve the above problem, and it is therefore an object of the present invention to achieve a microcomputer which has a function to detect whether the result of A/D conversion increases or decreases in order to make possible faster and more advanced control than the prior art for the application of an A/D converter.

The microcomputer according to the present invention comprises A/D conversion means for converting inputted analog values into digital values (A/D converter 1), first storage means for storing the result of conversion by this A/D conversion means, second storage means for storing the contents of this first storage means, arithmetic means for comparing the contents of the first and second storage means, third storage means for storing the result of comparison by this arithmetic means, and control means responsive to a conversion complete signal or a conversion start signal from the A/D conversion means to generate various timing signals which enables the storage operation of the above-mentioned storage means.

Furthermore, another microcomputer according to the present invention further comprises interrupt signal generating means to which the result of comparison by the arithmetic means is supplied and which generates interrupt signals in response to the above-mentioned timing signals.

Moreover, another microcomputer according to the present invention comprises arithmetic means for comparing the contents of the first and second storage means and also calculating an absolute value of the difference between them, and fourth storage means for storing this absolute value.

The result of detecting whether an analog value inputted into the A/D conversion means increases or decreases with the passage of time is stored in the third storage means in response to a timing signal so that the entire process of detecting changes in the result of A/D conversion can be performed by hardware, thus making it possible to speed up this processing which has conventionally been performed by software.

When an interrupt signal is supplied to the CPU, a read signal can be supplied as an interrupt signal and the result of comparison between the first and second storage means and a numerical difference therebetween can be identified.

The above and other objects, features and advantages of the invention will become more apparent from the following description when taken in conjunction with the accompanying drawings.

DESCRIPTION OF THE PREFERRED EMBODIMENT

Figure 1:
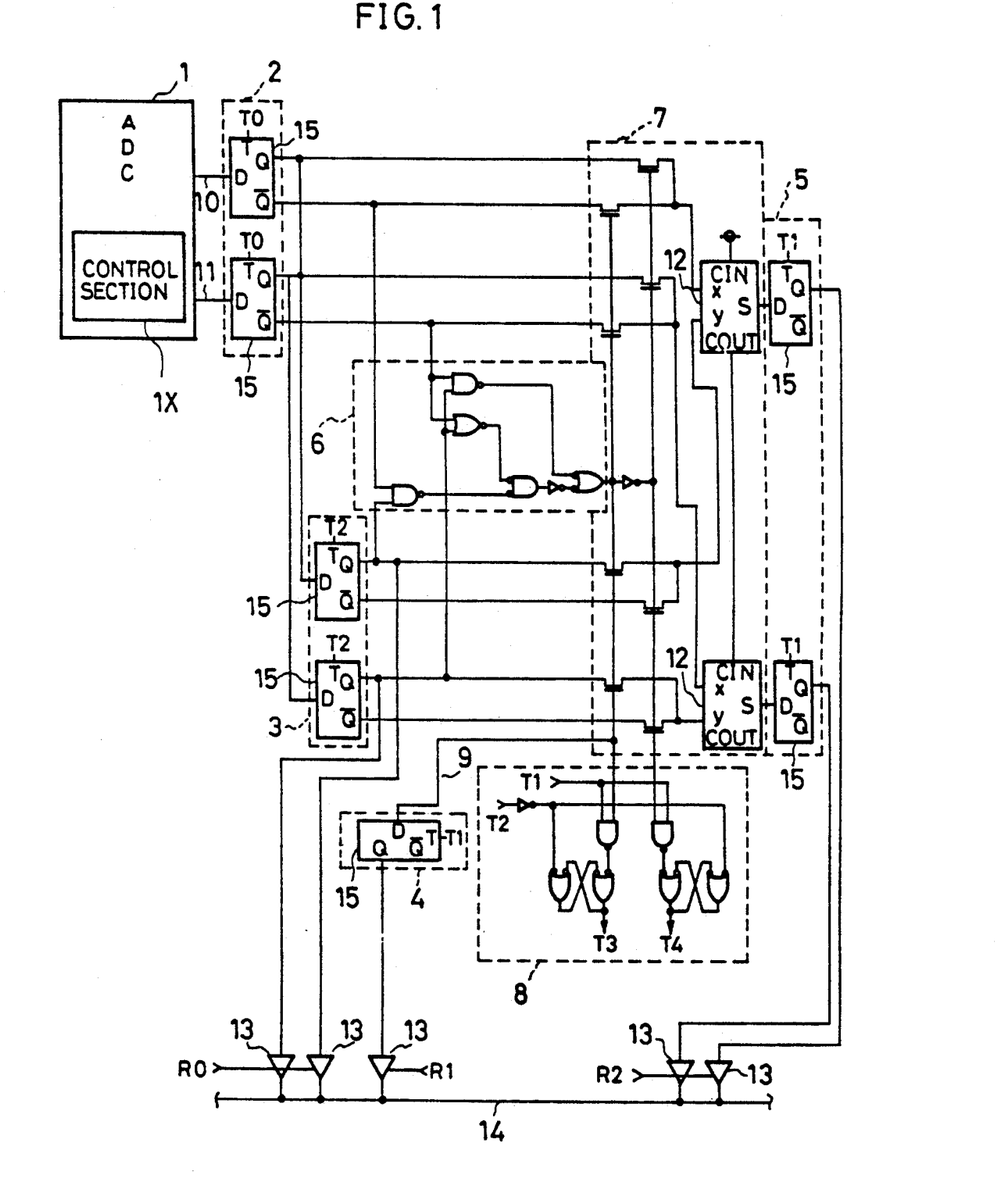
FIG. 1 is a diagram of the configuration of a microcomputer having a built-in A/D converter according to an embodiment of the present invention.
Figure 2A:
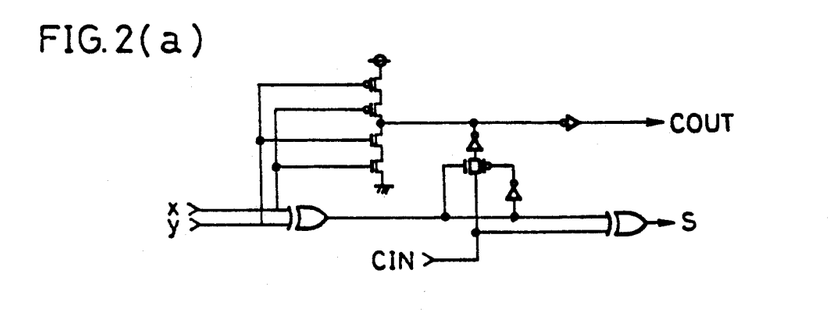
FIG. 2(a) is a diagram of the configuration of a full adder and FIG. 2(b) is a truth table thereof.
Figure 2B:
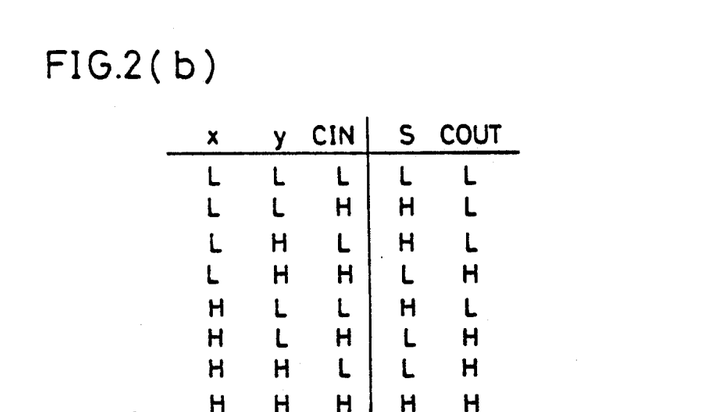

A preferred embodiment of the present invention will be described hereafter in conjunction with the accompanying drawings, taking a two-bit A/D converter as an example. In FIG. 1, reference numeral 1 represents an A/D converter as A/D conversion means for converting inputted analog values into digital values and incorporating a control section 1X for generating various timing signals in synchronism with an A/D conversion complete signal. Reference numeral 2 represents first storage means for storing the result of A/D conversion by the A/D converter 1 in response to a timing signal T0 which is synchronized with a rise in the A/D conversion complete signal, 3 second storage means for storing the contents of the first storage means in response to a signal T2 which is synchronized with a rise in the A/D conversion complete signal, 4 third storage means for storing the result of comparison between the contents of the first storage means and the contents of the second storage means in response to a signal T1 which is synchronized with a rise in the A/D conversion complete signal, 5 fourth storage means for storing an absolute value of the difference between the contents of the first and second storage means in response to the signal T1 which is synchronized with a rise in the A/D conversion complete signal, 6 arithmetic means consisting of a combinational circuit for comparing the contents of the first and second storage means, 7 arithmetic means for calculating an absolute value of the difference between the contents of the first and second storage means, 8 interrupt signal generation means which consists of a combinational circuit for generating two different interrupt signals T3 and T4 when the contents of the second storage means 3 are larger or smaller than those of the first storage means, 9 the output of the arithmetic means 6, a signal line which becomes "H" when the contents of the second storage means 3 are larger than those of the first storage means 2, and becomes "L" when the contents of the second storage means 3 are smaller. Numeral 10 represents a low-order bit data line of the A/D conversion result of the A/D converter 1, 11 a high-order bit data line of the A/D conversion result of the A/D converter 1, 12 a full adder constituting part of the arithmetic means 7 for calculating an absolute value of the difference between the first and second storage means which adds three inputs x, y and CIN to generate a sum output to S and a carry output for the next step to COUT as shown in FIG. 2. Numeral 13 represents a tri-state buffer, 14 a system bus, and 15 a latch constituting the above-mentioned first to fourth storage means. Like the prior art, data inputted into D is inputted into the latch 15 while T is at "H", and latched by the latch 15 while T is at "L" so that the latched data is outputted to Q and its inverted data is outputted to $\bar{Q}$.

Figure 4A:
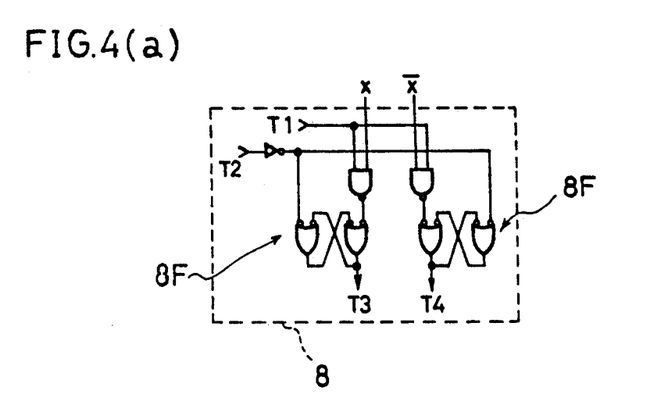
FIGS. 4(a)-4(b) are diagrams showing the configuration and input/output relationship of a combinational circuit forming interrupt generation means.
Figure 4B:
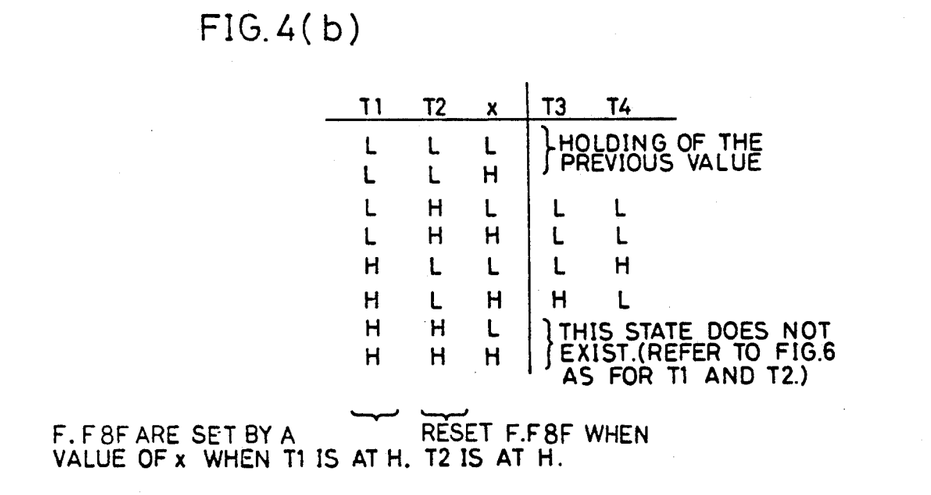
Figure 5:
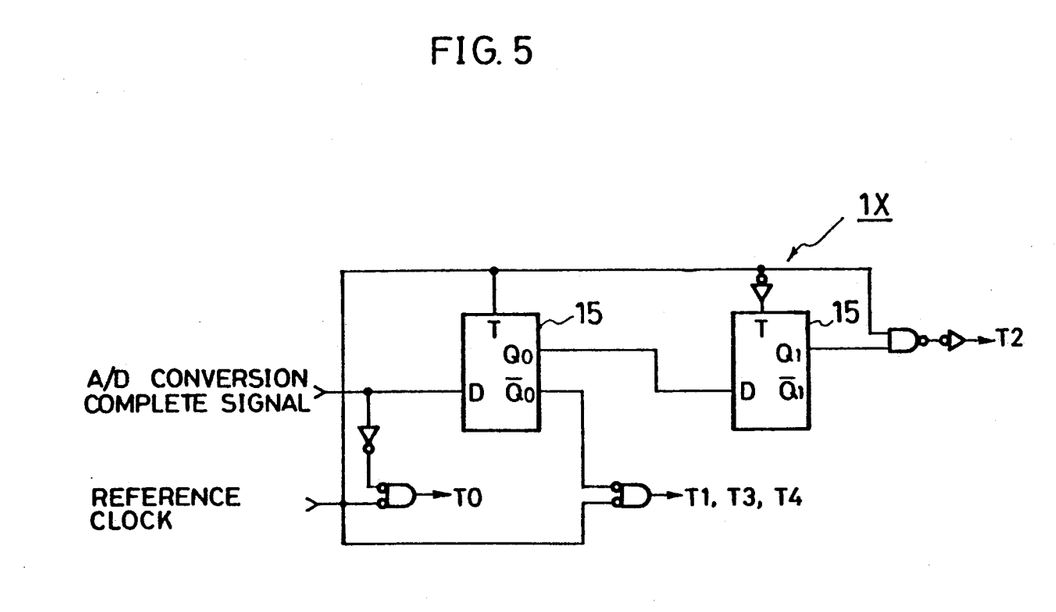
FIG. 5 is a diagram of the internal configuration of the control section.
Figure 6:
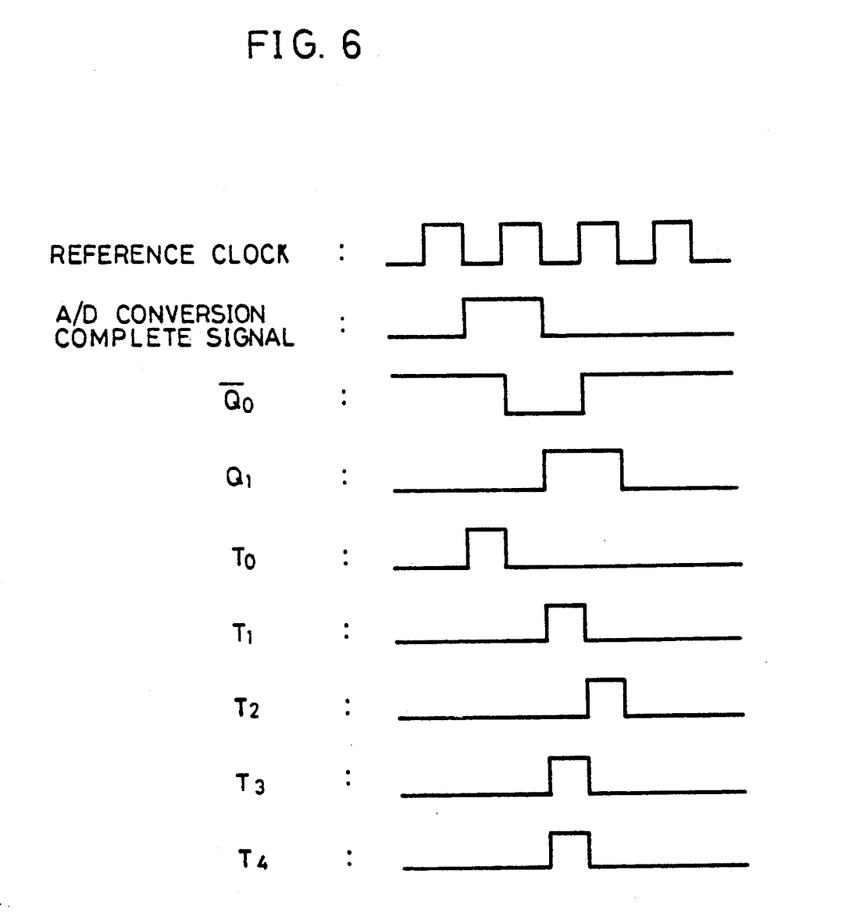
FIG. 6 is a timing chart of timing signals.

T0 is a timing signal for storing the AD conversion result of the A/D converter 1 in the first storage means 2, which is generated in synchronism with a rise in the A/D conversion complete signal. T1 is a timing signal for storing an absolute value of the difference between the contents of the first and second storage means 2 and 3 obtained from the arithmetic means 6 and 7, and for storing in the third storage means 4 the result of comparison between the contents of the first and second storage means 2 and 3 obtained from the arithmetic means 6. T2 is a timing signal for storing the contents of the first storage means 2 in the second storage means 3, which is outputted after the elapse of a preset time from a rise in the A/D conversion complete signal. T3 is an interrupt signal (synchronized with the signal T1) which is generated when the contents of the second storage means 3 are larger than those of the first storage means 2. T4 is an interrupt signal (synchronized with the signal T1) which is generated when the contents of the second storage means 3 are not larger than those of the first storage means 2. As shown in FIG. 4 and FIG. 6, T3 and T4 are set in synchronism with the signal T1 and reset by the signal T2. The timing signals T0 to T2 are generated by the control section 1X (FIG. 5) incorporated in the A/D converter 1. The timing relationships between the reference clock, the A/D conversion complete signal, and the timing signals T0 to T4 are shown in FIG. 6.

R0 is a signal which becomes active when the contents of the second storage means 3 are read out to the system bus 14, R1 a signal which becomes active when the contents of the third storage means 4 are read out to the system bus 14, and R2 a signal which becomes active when the contents of the fourth storage means 5 are read out to the system bus 14. In other words, the CPU 1A activates R0 to R2 to read out the contents of each storage means to the system bus 14. This operation can be processed by software.

Figure 3A:
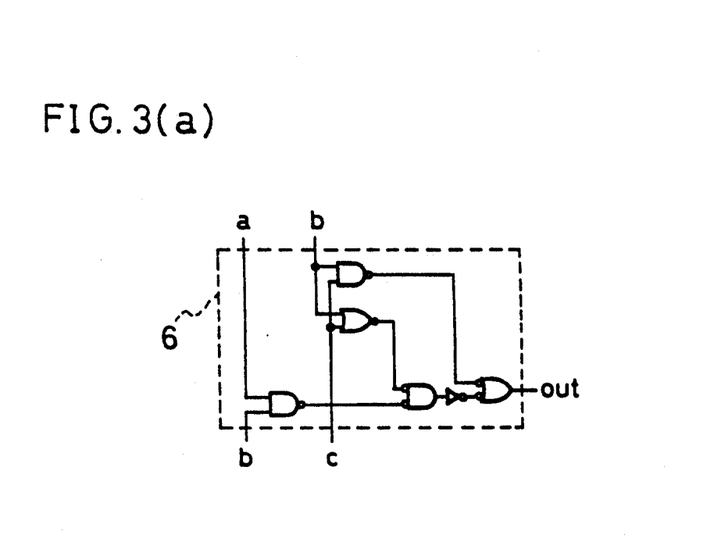
FIGS. 3(a)-3(b) are diagrams showing the configuration and input/output relationship of a combinational circuit forming arithmetic means.
Figure 3B:
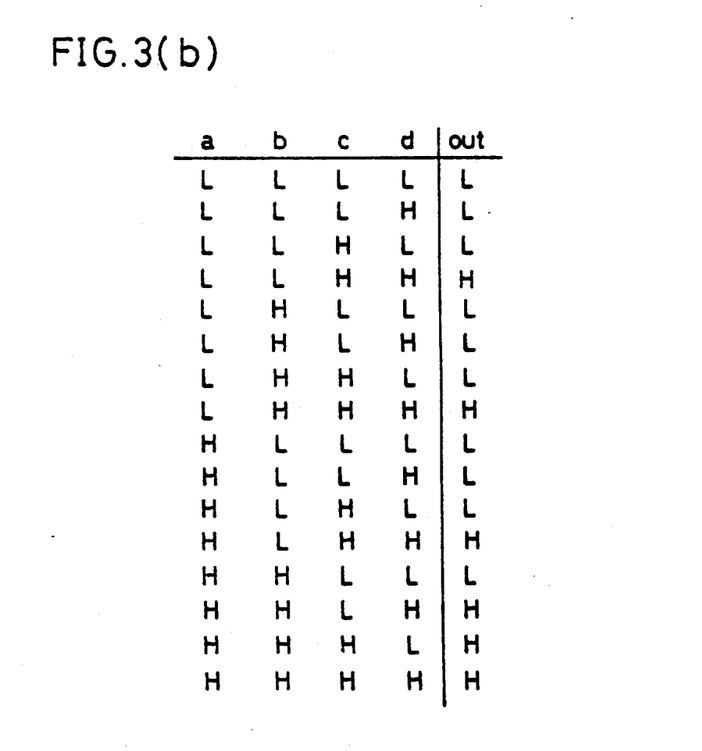

The operation of the microcomputer will be described hereafter. Upon completion of A/D conversion by the A/D converter 1, the result of conversion obtained by the A/D converter 1 is stored in the first storage means 2 by the signal T0. At this time, the result of the previous A/D conversion is already stored in the second storage means 3. Thereafter, the arithmetic means 6 for comparing the contents of the first and second storage means 2 and 3 performs an arithmetic operation. This arithmetic means 6 is a combinational circuit which outputs to the output line 9 an "H" signal when the contents of the second storage means 3 are larger than those of the first storage means 2, and an "L" signal when the contents of the second storage means 3 are not larger than those of the first storage means 2 (a truth table showing the input/output relationship is shown in FIG. 3(b)). The signal outputted to the output line 9 is stored in the third storage means 4 by the timing signal T1. At the same time, the arithmetic means 6 for comparing the contents of the first and second storage means and the arithmetic means 7 for calculating an absolute value of the difference therebetween are used to store these results in the fourth storage means 5 in response to the timing signal T1.

To obtain the absolute value of the difference between the contents of the first and second storage means, when the contents of the second storage means 3 are larger than those of the first storage means 2, the arithmetic means 7 for obtaining the absolute value of the difference adds the contents of the second storage means 3 and the inverted data of the contents of the first storage means 2, and increments the sum by one. In other words, the contents of the first storage means 2 are subtracted from the contents of the second storage means 3, and the result of the subtraction is always positive because the contents of the second storage means 2 are larger than those of the first storage means 2. Reversely, when the contents of the second storage means 3 are not larger than those of the first storage means 2, the arithmetic means 7 adds the inverted data of the contents of the second storage means 3 and the contents of the first storage means 2, and increments the sum by one. In other words, the contents of the second storage means 3 are subtracted from those of the first storage means 2, and the result of this subtraction is always positive because the contents of the second storage means 3 are not larger than those of the first storage means 2. In this way, an absolute value of the difference between the contents of the first and second storage means 2 and 3 can be obtained.

At the same time, the signals T3 and T4 are outputted from the interrupt signal generation means 8 in synchronism with the signal T1, and are reset by the signal T2. The signal T3 is used as a signal for generating an interrupt when the contents of the second storage means 3 are larger than those of the first storage means 2, while the signal T4 is used as a signal for generating an interrupt when the contents of the second storage means 3 are not larger than those of the first storage means 2. The input/output relationship of the interrupt signal generating means 8 is shown in FIG. 4(b). The reference symbol 8F of FIG. 4(a) represents a flip-flop.

Finally, the results of operations performed on the contents of the first and second storage means 2 and 3 by the arithmetic means 6 for comparison and the arithmetic means 7 for calculating an absolute value of the difference between the contents of the first and second storage means are stored in the third and fourth storage means 4 and 5, and thereafter, the contents of the first storage means 2 are stored in the second storage means 3 by the signal T2. In other words, at this time, the result of the latest conversion is stored in the second storage means 3.

The contents of the second, third and fourth storage means 3, 4 and 5 can be read out to the system bus 14 through the tri-state buffer 13 by the signals R0, R1 and R2, respectively.

In the above embodiment, it has been explained that the timing signal T2 for storing the contents of the first storage means 2 in the second storage means is synchronized with the A/D conversion complete signal. However, the timing signal may be synchronized with the A/D conversion start signal. In this case, the latest data after the completion of A/D conversion is stored in the first storage means 2.

The timing signals T0, T1, T2, T3 and T4 have been described, but if the arithmetic means 6 and 7 perform operations on the contents of the first and second storage means 2 and 3, respectively, with the results of the operations being stored in the third and fourth storage means 4 and 5, respectively, and at the same time, interrupt signals T3 and T4 can be generated; these storage operations are not restricted by the timing signals T0, T1, T2, T3 and T4, and may be arbitrary.

In other words, control means (control section 1X) for generating timing signals (T0 to T2) in response to an A/D conversion complete or start signal is provided to enable the storage operation of each storage means in response to a desired timing signal.

As described in the foregoing, the microcomputer of the present invention comprises A/D conversion means for converting inputted analog values into digital values, first storage means for storing the result of conversion by the A/D conversion means, second storage means for storing the contents of this first storage means, arithmetic means for comparing the contents of the first and second storage means, third storage means for storing the result of comparison by the arithmetic means, and control means responsive to a conversion complete or start signal from the A/D conversion means to generate various timing signals, which enables the above-mentioned storage means to perform storage operations, thus making it possible for hardware to detect whether an analog value inputted into the A/D converter increases or decreases with the passage of time and that processing which has conventionally been performed by software can be performed at a high speed. As a result, more advanced control is possible.

Due to the provision of interrupt signal generation means, the completion of the storage of the result of comparison by the arithmetic means and the completion of the storage of an absolute value of the difference can be reported to the CPU so that the result of comparison and the value can be identified by a read signal.

Since the microcomputer further comprises arithmetic means for comparing contents stored in the first and second storage means, arithmetic means for calculating an absolute value of the difference between these contents, and fourth storage means for storing the contents of the absolute value obtained by the arithmetic means, a numerical value of a change in an analog value when the analog value increases and decreases can be stored.

What is claimed is:

1. A microcomputer comprising:
   A/D conversion means for converting inputted analog values into digital values;
   first storage means for storing the result of conversion by said A/D conversion means;
   second storage means for storing the contents of said first storage means;
   arithmetic means for comparing the contents of said first storage means and the contents of said second storage means;
   third storage means for storing the result of comparison by said arithmetic means; and
   control means responsive to a conversion complete signal or a conversion start signal from said A/D conversion means to generate various timing signals, which enable all of said storage means to perform storage operations.

2. A microcomputer comprising:
   A/D conversion means for converting inputted analog values into digital values;
   first storage means for storing the result of conversion by said A/D conversion means;
   second storage means for storing the contents of said first storage means;
   arithmetic means for comparing the contents of said first storage means and the contents of said second storage means;
   third storage means for storing the result of comparison by said arithmetic means;
   control means responsive to a conversion complete signal or a conversion start signal from said A/D conversion means to generate various timing signals, which enable all of said storage means to perform storage operations; and interrupt signal generating means to which the result of comparison by said arithmetic means is supplied and which outputs interrupt signals in response to said timing signals.

3. A microcomputer comprising:

A/D conversion means for converting inputted analog values into digital values;

first storage means for storing the result of conversion by said A/D conversion means;

second storage means for storing the contents of said first storage means;

arithmetic means for comparing the contents of said first storage means and the contents of said second storage means and for calculating an absolute value of the difference between these contents;

third storage means for storing the result of comparison by said arithmetic means;

fourth storage means for storing the contents of the absolute value obtained by said arithmetic means; and control means responsive to a conversion complete signal or a conversion start signal from said A/D conversion means to generate various timing signals, which enable all of said storage means to perform storage operations.

* * * * *

UNITED STATES PATENT AND TRADEMARK OFFICE
CERTIFICATE OF CORRECTION

PATENT NO. : 5,301,140
DATED : April 5, 1994
INVENTOR(S) : Nobusuke Abe

It is certified that error appears in the above-indentified patent and that said Letters Patent is hereby corrected as shown below:

On the title page, item (54) and column 1, in the title "OVERTIME" should read --OVER TIME--.

Signed and Sealed this

Ninth Day of August, 1994

Attest:

BRUCE LEHMAN

Attesting Officer        Commissioner of Patents and Trademarks